(12) United States Patent
Marton

(10) Patent No.: US 7,148,759 B2
(45) Date of Patent: Dec. 12, 2006

(54) PHASE-LOCKED LOOP CIRCUIT

(75) Inventor: Walter Marton, Offenbach (DE)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/197,779

(22) Filed: Aug. 5, 2005

(65) Prior Publication Data

US 2006/0028284 A1    Feb. 9, 2006

Related U.S. Application Data

(63) Continuation of application No. PCT/EP03/02371, filed on Mar. 7, 2003.

(51) Int. Cl.
*H03L 7/00* (2006.01)
(52) U.S. Cl. ............................ 331/17; 331/1 A
(58) Field of Classification Search ................ 331/17, 331/1 A
See application file for complete search history.

(56) References Cited

U.S. PATENT DOCUMENTS

| 5,175,729 | A |  | 12/1992 | Borras et al. |
| 5,461,344 | A |  | 10/1995 | Andoh |
| 6,356,158 | B1 | * | 3/2002 | Lesea .......................... 331/11 |
| 6,389,092 | B1 | * | 5/2002 | Momtaz ..................... 375/376 |
| 6,476,681 | B1 |  | 11/2002 | Kirkpatrick |

* cited by examiner

*Primary Examiner*—Joseph Chang
(74) *Attorney, Agent, or Firm*—Arent Fox PLLC

(57) ABSTRACT

A PLL circuit comprising a loop filter with at least a first and a second bandwith is provided. The first bandwidth of the loop filter is determined by a first network of circuit components and used out of the linear range of the PLL circuit and the second bandwith is determined by a second network of circuit components and used within the linear range of the PLL circuit. A node of said second network is charged to a voltage level given by a node of said first network while the second network is switched off. When the second network is switched in, no long lasting charging process is required. Therefore, the lock time of the PLL circuit is reduced.

10 Claims, 4 Drawing Sheets

PHASE-LOCKED LOOP CIRCUIT

This nonprovisional application is a continuation application of and claims the benefit of International Application No. PCT/EP2003/02371, filed Mar. 7, 2003. The disclosure of the prior application is hereby incorporated herein in its entirety by reference.

The present invention relates to a phase-locked loop (PLL) circuit and in particular to a loop filter circuit in a PLL circuit.

PLL circuits are widely used circuit building blocks. A few of their applications are tone decoding, demodulation of AM and FM signals, frequency multiplication, frequency synthesis, pulse synchronisation of signals from noisy sources and the regeneration of signals without noise. Typically, a PLL comprises a phase detector circuit, an amplifier or charge pump and a voltage controlled oscillator (VCO). The phase detector circuit detects whether two signals are in or out of phase. One of these signals is a reference signal. The other one is generated in the PLL. The charge pump generates an analog signal with a high current drive suitable for the control of the VCO. The charge pump signal has usually two fixed current values of the same amount, but opposite sign corresponding to the digital 0 and 1 respectively provided by the phase detector. The frequency of the VCO is adjusted until the reference signal and the signal which is compared to the reference signal are synchronised.

The signal generated in the PLL and being compared to the reference signal is not necessarily identical with the signal generated by the VCO. For a very common application, the signal of the VCO is firstly divided by a divider and then fed into the phase detector. The VCO therefore generates a frequency which is by a factor given by the inverse of the divider ratio higher than the reference signal (frequency multiplication).

In digital PLLs, EXOR gates are commonly used as phase detectors. If the reference signal and the signal generated in the PLL do not have a duty factor of 50% at the beginning, their duty factors are often altered to 50% before comparison by the phase detector. A duty factor of 50% is very suitable for EXOR detectors. In this case, the duty factor of the signal generated by the EXOR gate increases linearly with increasing phase difference between the two compared signals and reaches its maximum value of 100% for a phase difference of 180 degrees and decreases afterwards again. A duty factor of 50% occurs for a phase difference of ±90 degrees.

Using an EXOR gate as phase detector for example, it is extremely difficult to synchronize both signals if the phase difference between both signals is larger than 180 degrees because the relationship between the phase difference signal and the phase difference is no more linear. Such large phase differences can for example occur if the divider ratio is changed, the frequency of the reference signal changes or mechanical stress such as vibrations or shocks is applied to the PLL.

Before the signal provided by the charge pump is fed to the VCO, a DC signal is usually generated in a loop filter. This filter averages the signal provided by the charge pump. As the charge pump typically generates two fixed current values of the same amount, but opposite sign corresponding to the digital 0 and 1 respectively provided by the phase detector, the filtered signal will be zero for a phase difference of ±90 degrees when the duty factor is 50% in the ideal case. A zero current at the input of the VCO usually signifies that the VCO maintains its frequency. Hence, the phase shift between the reference signal and the signal compared to the reference signal is 90 degrees in steady-state conditions (the phase-locked loop is locked). However, real charge pumps cannot provide two current values of exactly the same amount, but opposite sign. In steady-state conditions, the phase shift between the reference signal and the signal compared to the reference signal is therefore in general not exactly 90 degrees.

Besides, the loop filter contributes considerably to the fact that the signal compared to the reference signal is unable to follow the changes of the reference signal immediately because it has to be charged. The times it takes until the phase-locked loop circuit reaches its steady-state conditions, i.e. the lock time, depends on the qualities of the loop filter. In general, low pass filters are used as loop filters. Whereas a loop filter with a broad bandwith is able to follow the changes of the phase difference signal quite rapidly, a loop filter with a narrow band slowly follows the changes of the phase difference signals, but provides a signal free of ripple as required by the VCO. Such ripple would provoke the variation of the VCO frequency.

The patent application US 2002/0041214 discloses a PLL circuit, wherein the lock time is shortened by increasing the output current of the charge pump during lock-up. Due to the increase of the output current, the loop filter is charged more rapidly. Thus, a quick lock time can be achieved for a filter with a narrow bandwith suited for the VCO.

However, the two output current values of the charge pump cannot be controlled very exactly as mentioned before. The unsatisfactory control of the output current results in a dependence of the actual phase shift between the reference signal and the signal compared to the reference signal on the amount of the two output current values of the charge pump disturbing the lock-up of the phase-locked loop. A further disadvantage of the disclosed circuit is its complexity.

The U.S. Pat. No. 4,482,869 discloses a PLL circuit based on a dual bandwith loop filter. The broad bandwith is used during lock-up. The filter is then able to follow the changes of the phase difference signals quickly, whereas the narrow bandwidth is used in the linear range leading to the generation of a signal free of ripple. Problems might arise when the bandwith is switched from the broad bandwith to the narrow bandwith. Therefore, the narrow bandwith is achieved by switching-in only components which do not have to be loaded, i.e. resistors. A disadvantage is that this limits the flexibility in the design and performance of the filter.

The object underlying the present invention is to provide a phase-locked loop circuit enabling quick lock times and ripple free signals at the input of the voltage controlled oscillator without the requirement of complex circuitry. Further, a corresponding loop filter circuit and an advantageous method for operating the loop filter circuit are to be provided.

In one aspect of the present invention, a phase-locked loop circuit comprising: a voltage controlled oscillator generating oscillator signals with frequencies dependent on filtered signals applied to said voltage controlled oscillator; a phase detector circuit providing phase difference signals on the basis of the phase difference of said oscillator signals and reference signals; a loop filter circuit with at least a first and a second bandwith filtering said phase difference signals and providing said filtered signals, said first bandwith being determined by a first network of circuit components being switched in when said phase-locked loop circuit is not locked, said second band-with being determined by a second network of circuit components being switched in when said phase-locked loop circuit is locked; is characterized in that a bias circuit is applying a voltage value of a node of said first network to a node of said second network when said second network is switched off and in that the circuit components of said second network are being charged before the second network is switched in.

An advantage of the present invention is that the circuit components of said first network are already charged before they are switched in. Therefore the output signal of the loop filter circuit is not distorted by the switching action.

A further advantage is that-circuit components with a high capacitance can be used exclusively for the locked operation.

In one feature of the present invention, said oscillator signals are applied to a divider before being applied to the phase-locked loop circuit.

In another feature of the present invention, said phase difference signals are applied to a charge pump circuit before being filtered by said loop filter circuit.

In a further feature of the present invention, said phase detector circuit is an EXOR gate.

In yet a further feature of the present invention, the switching-in of said first network and said second network is controlled by signals indicating whether said phase-locked loop is locked.

In a further feature of the present invention, no component being part of said first network is part of said second network.

In another feature of the invention, said bias circuit comprises at least one voltage follower.

In a second aspect of the present invention, a filter circuit for a phase-locked loop with at least a first and a second bandwidth, said first bandwidth being determined by a first network of circuit components and being used when said phase-locked loop circuit is not locked, said second bandwith being determined by a second network of circuit components being used when said phase-locked loop circuit is locked; is characterized in that a bias circuit is applying a voltage value of a node of said first network to a node of said second network when said second network is switched off and in that the circuit components of said second network are being charged before the second network is switched in.

In a third aspect of the present invention, a method for operating a loop filter circuit filtering phase difference signals with at least a first bandwidth being determined by a first network of circuit components and a second bandwidth being determined by a second network of circuit components in a phase-locked loop circuit with a voltage controlled oscillator generating oscillator signals with frequencies dependent on filtered signals applied to said voltage controlled oscillator and a phase detector circuit providing said phase difference signals on the basis of the phase difference of said oscillator signals and reference signals, comprising the following steps: Switching-in of said first network when said phase-locked loop circuit is not locked; Switching-in of said second network when said phase-locked loop circuit is locked; is characterized by the following steps: applying a voltage value of a node of said first network to a node of said second network when said second network is switched off; charging of the circuit components of said second network before the second network is switched in.

In a further feature of the present invention, said oscillator signals are applied to a frequency modulator circuit before being applied to the phase-locked loop circuit.

Embodiments of the present invention will now be described, by the way of example only, with reference to the following drawings in which.

Figure 1:
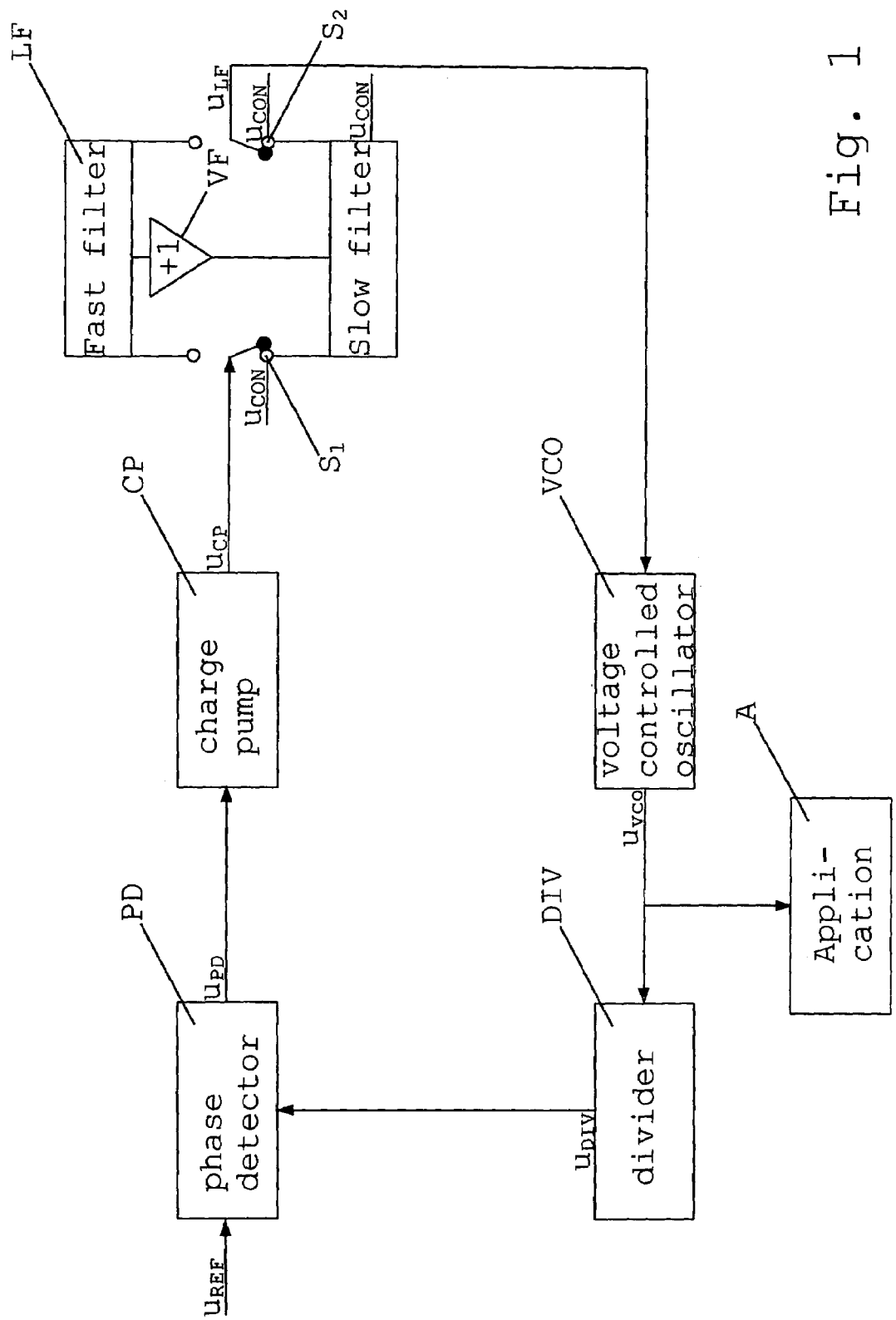
FIG. 1 is a block diagram of a PLL circuit according to the invention.

As shown in FIG. 1, a PLL circuit according to the present invention has the same design as a state-of-the-art circuit except that a different loop filter is used. The phase detector PD compares two signals $u_{REF}$ and $u_{DIV}$, wherein $u_{REF}$ is a reference signal and $u_{DIV}$ is a signal provided by the divider DIV. It consists typically of an EXOR gate. Based on the comparison of these two signals, the phase detector provides the phase difference signals $u_{PD}$ at its output. The digital signal $u_{PD}$ is converted to an analog signal in the charge pump CP suitable for the control of the VCO.

Before the signal generated by the charge pump $u_{CP}$ is received at the voltage controlled oscillator, the signal $u_{CP}$ is filtered in the loop filter LF. The loop filter LF has two filter paths being switched in and off by the switches $S_1$ and $S_2$ being controlled by the control signals $u_{con}$ which might be generated by the phase detector. Alternatively, the signals $u_{con}$ might indicate that the divider ratio was changed a certain time ago and that the phase-locked loop circuit is now definitively locked as estimates for the lock time are known. The fast filter path is used for lock-up and has a wide bandwith. The slow filter path is used when the phase-locked loop is locked and has a narrow band with. The slow filter paths comprises internal switches being controlled by $u_{con}$ signals. Internal switches control the charging of circuit components of the slow filter. The fast filter path and the slow filter path are connected by a voltage follower VF. The loop filter LF provides the signal $u_{LF}$ which controls the VCO at its output.

The signal provided at output of the,voltage controlled oscillator is delivered to the application A and applied at the divider DIV. The divider DIV divides the frequency of the $u_{VCO}$ signal by the divider ratio and provides the signal $u_{DIV}$ which is compared to the reference signal at its output. In steady-state conditions, the VCO generates a signal which is by a factor corresponding to the inverse of the divider ration higher than the reference signal and delivers it to the application A.

Figure 2:
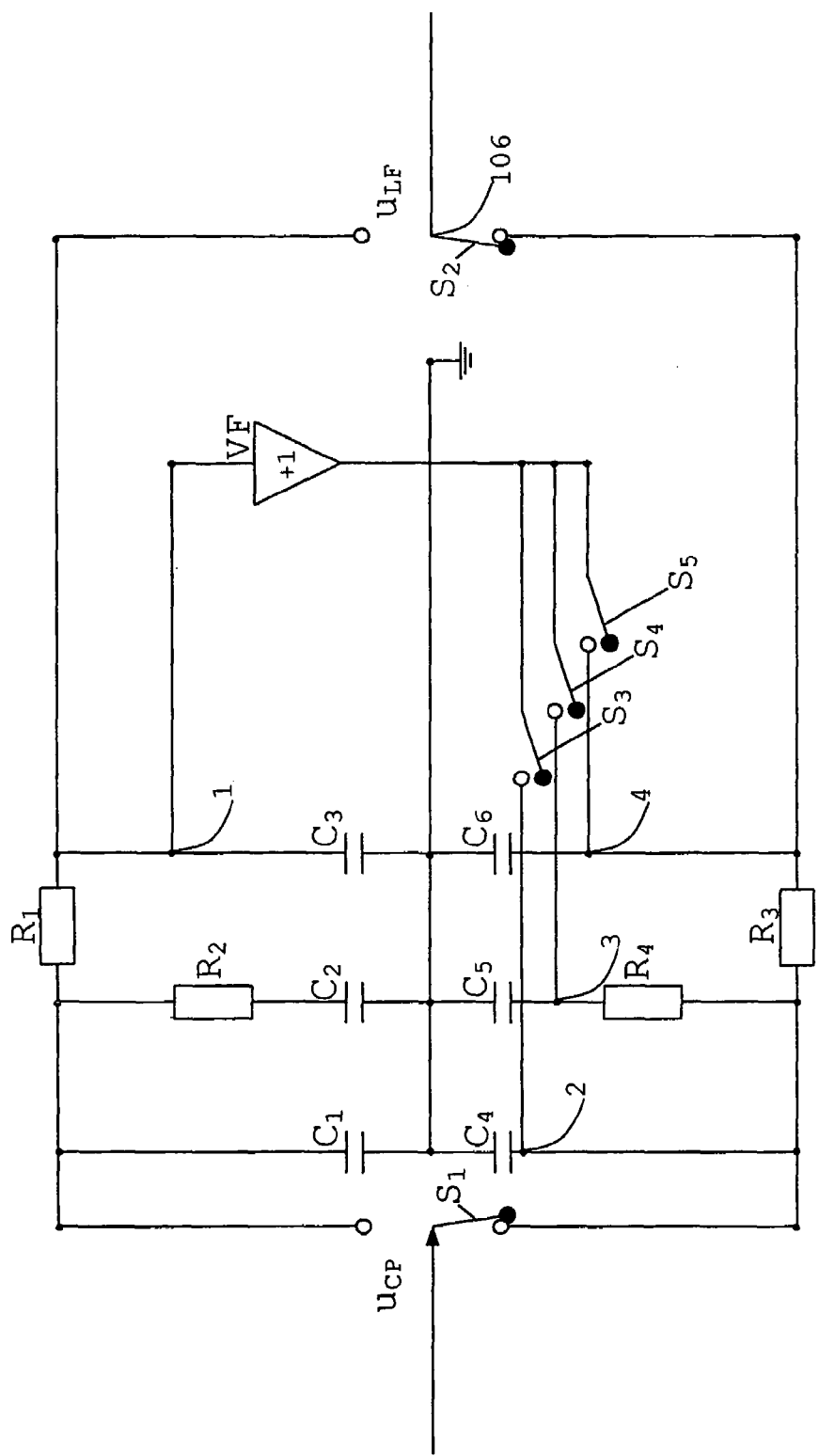
FIG. 2 is a circuit diagram showing the loop filter used in the circuit of FIG. 1.

The loop filter of FIG. 1 is shown in FIG. 2 in detail. The switches $S_1$, $S_2$, $S_3$, $S_4$, and $S_5$ are controlled by the signal $u_{con}$ of FIG. 1. The loop filter is shown for the case that the phase-locked loop is locked. The fast filter path comprising the circuit components $C_1$, $C_2$, $C_3$, $R_1$, and $R_2$ is switched off and the slow filter path comprising the circuit components $C_4$, $C_5$, $C_6$, $R_3$, and $R_4$ is switched in. The voltage follower VF is disconnected from the slow filter path by the switches $S_3$, $S_4$, $S_5$. The loop filter must not necessarily consist of two or more filter paths. It might also comprise circuit components used when the phase-locked loop is either locked or unlocked.

During lock-up, the fast filter path is switched in using the switches $S_1$ and $S_2$ and the voltage follower VF applies the voltage level of node 1 of the network of the circuit components $C_1$, $C_2$, $C_3$, $R_1$, and $R_2$ to the nodes 2, 3, and 4 of the network of the circuit components $C_4$, $C_5$, $C_6$, $R_3$, and $R_4$.

The two circuit paths do have the same design. However, they have different transfer characteristics due to different values for their circuit components. Especially, large capacitors $C_4$, $C_5$, and $C_6$ are preferred for the slow filter path used within the linear range, whereas small capacitors $C_1$, $C_2$, $C_3$ are preferred for the fast filter path used during lock-up. The small capacitors are able to follow sudden changes quickly and shorten the lock time. The charging of the large capacitors $C_4$, $C_5$, and $C_6$ takes long and they cannot follow sudden voltage changes. However, the large capacitors $C_4$, $C_5$, and $C_6$ are not susceptible to quick voltage changes. The signal provided by the fast filter path is therefore free of ripple.

Figure 3:
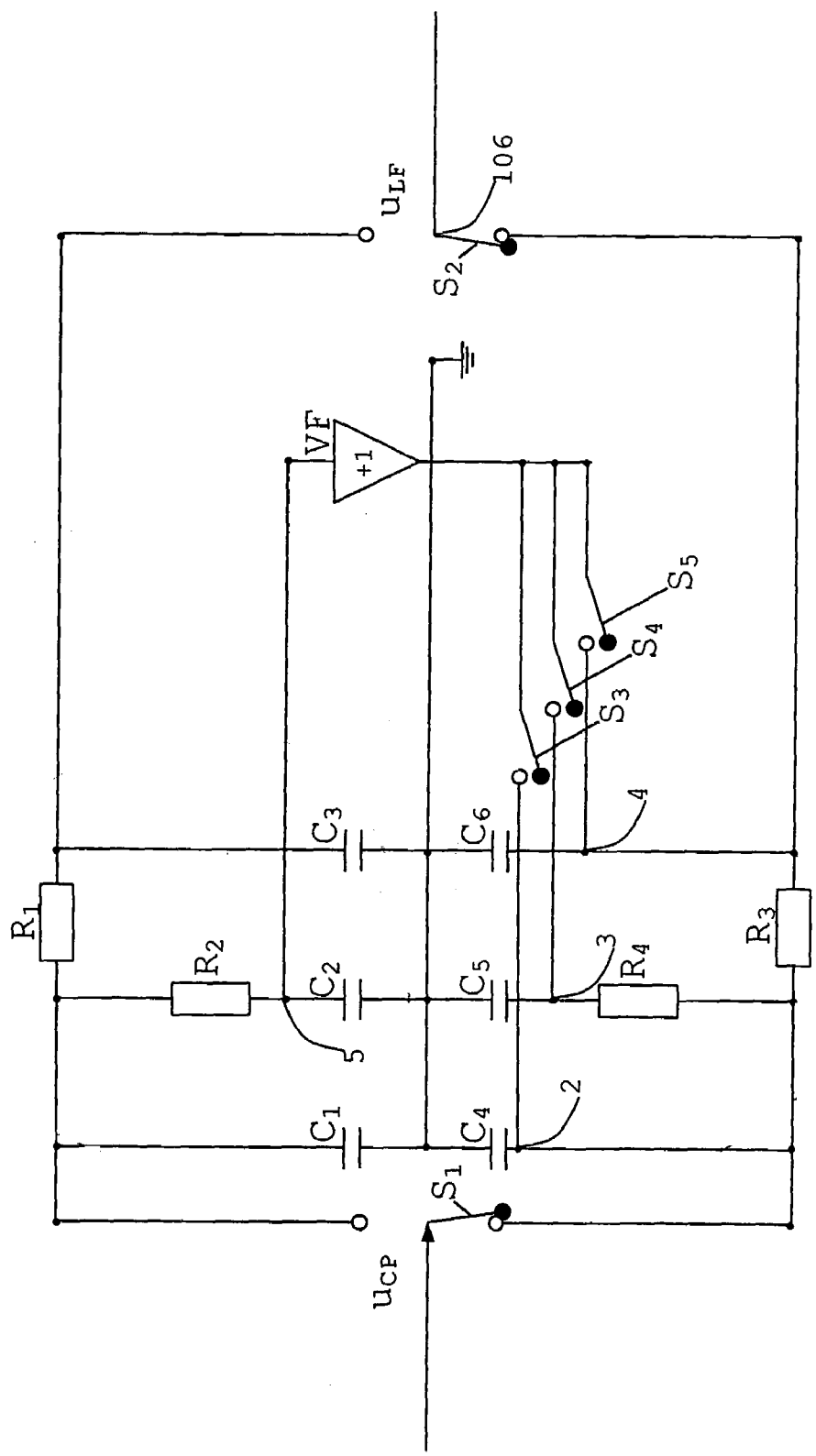
FIG. 3 is a circuit diagram showing an alternative loop filter.

FIG. 3 shows an alternative filter. The reference numerals of FIG. 2 are used for similar circuit components. In contrast to FIG. 2, the voltage follower applies the voltage level of node 5 of the network of circuit components $C_1$, $C_2$, $C_3$, $R_1$, and $R_2$ to the nodes 2, 3, and 4 of the network of the circuit components $C_4$, $C_5$, $C_6$, $R_3$, and $R_4$.

Figure 4:
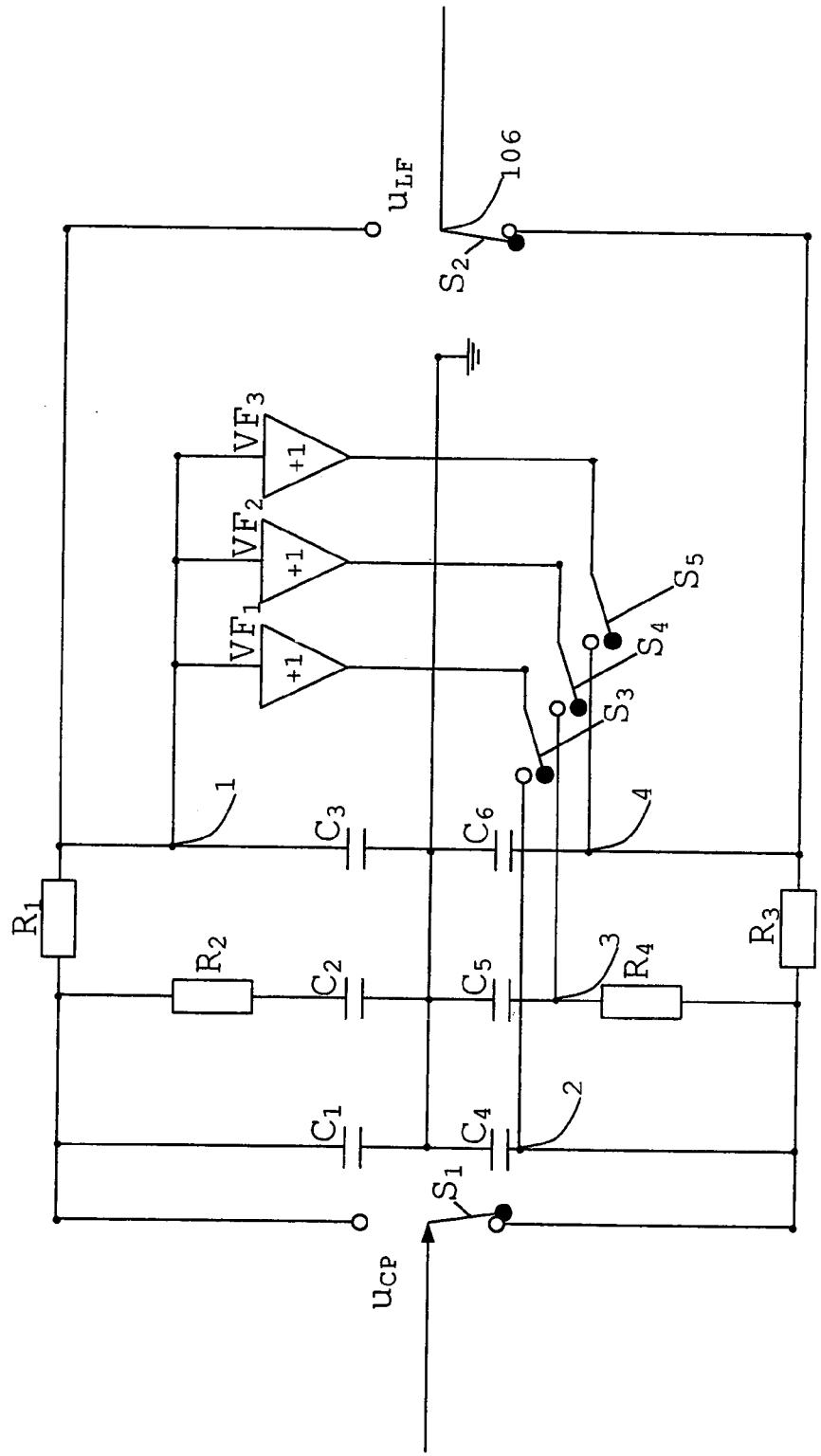
FIG. 4 is a circuit diagram showing a further alternative loop filter.

FIG. 4 shows a further alternative filter. The reference numerals of FIG. 2 are used for similar circuit components. In contrast to FIG. 2, the bias circuit consisting of three voltage followers $VF_1$, $VF_2$, and $VF_3$ applies the voltage level of node 1 of the network of circuit components $C_1$, $C_2$, $C_3$, $R_1$, and $R_2$ to the nodes 2, 3, and 4 of the network of the circuit components $C_4$, $C_5$, $C_6$, $R_3$, and $R_4$.

The invention claimed is:

1. A phase-locked loop circuit comprising:
a voltage controlled oscillator (VCO) generating oscillator signals ($U_{vco}$) with frequencies dependent on filtered signals ($U_{cp}$) applied to said voltage controlled oscillator (VCO);
a phase detector circuit (PD) providing phase difference signals ($U_{PD}$) on the basis of the phase difference of said oscillator signals ($U_D$) and reference signals ($U_{REF}$);
a loop filter circuit (LF) with at least a first and a second bandwidth filtering said phase difference signals and providing said filtered signals, said first bandwidth being determined by a first network of circuit components ($C_1$, $C_2$, $C_3$, $R_1$, $R_2$) being switched in when said phase-locked loop circuit is not locked, said second bandwidth being determined by a second network of circuit components ($C_4$, $C_5$, $C_6$, $R_3$, $R_4$) being switched in when said phase-locked loop circuit is locked; and
a bias circuit (VF) applying a voltage value of a node (5) of said first network to a node (2) of said second network when said second network is switched off so that the circuit components ($C_4$, $C_5$, $C_6$, $R_3$, $R_4$) of said second network are being charged before the second network is switched in, wherein
the node (5) of said first network ($C_1$, $C_2$, $C_3$, $R_1$, $R_2$) is situated at the interconnection of a capacitor ($C_2$) and a first end of a resistor ($R_2$) connected in series, the second end of said resistor ($R_2$) being connected to a signal path between the input and the output of said first network of circuit components ($C_1$, $C_2$, $C_3$, $R_1$, $R_2$).

2. The phase-locked loop according to claim 1, characterized in that said oscillator signals ($U_{vco}$) are applied to a divider (DIV) before being applied to the phase detector circuit (PD).

3. The phase-locked loop circuit according to claim 1 or 2, characterized in that said phase difference signals ($U_{PD}$) are applied to a charge pump circuit (CP) before being filtered by said loop filter circuit (LF).

4. The phase-locked loop circuit according to claim 1 or 2, characterized in that said phase detector circuit (PD) is an EXOR gate.

5. The phase-locked loop circuit according to claim 1 or 2, characterized in that the switching-in of said first said first network and said second network is controlled by signals indicating whether said phase-locked loop is locked.

6. The phase-locked loop circuit according to claim 1 or 2, characterized in that no component being part of said first network is part of said second network.

7. The phase-locked loop circuit according to claim 1 or 2, characterized in that said bias circuit (VF) comprises at least one voltage follower (VF).

8. A filter circuit for a phase-locked loop with at least a first and a second bandwidth, said first bandwidth being determined by a first network of circuit components ($C_1$, $C_2$, $C_3$, $R_1$, $R_2$) and being used when said phase-locked loop circuit is not locked, said second bandwidth being determined by a second network of circuit components ($C_4$, $C_5$, $C_6$, $R_3$, $R_4$) being used when said phase-locked loop circuit is locked; and
a bias circuit (VF) applying a voltage value of a node (5) of said first network to a node (2) of said second network when said second network is switched off so that the circuit components ($C_4$, $C_5$, $C_6$, $R_3$, $R_4$) of said second network are being charged before the second network is switched in, wherein
said node (5) of said first network ($C_1$, $C_2$, $C_3$, $R_1$, $R_2$) is situated at the interconnection of a capacitor ($C_2$) and a first end of a resistor ($R_2$) connected in series, the second end of said resistor ($R_2$) being connected to a signal path between the input and the output of said first network of circuit components ($C_1$, $C_2$, $C_3$, $R_1$, $R_2$).

9. A method for operating a loop filter circuit filtering phase difference signals with at least a first bandwidth being determined by a first network of circuit components ($C_1$, $C_2$, $C_3$, $R_1$, $R_2$) and a second bandwidth being determined by a second network of circuit components ($C_4$, $C_5$, $C_6$, $R_3$, $R_4$) in a phase-locked loop circuit with a voltage controlled oscillator (VCO) generating oscillator signals ($U_{vco}$) with frequencies dependent on filtered signals ($u_{cp}$) applied to said voltage controlled oscillator (VCO) and a phase detector circuit (PD) providing said phase difference signals ($U_{PD}$) on the basis of the phase difference of said oscillator signals ($U_D$) and reference signals ($U_{REF}$), comprising the following steps:
Switching-in of said first network when said phase-locked loop circuit is not locked;
Switching-in of said second network when said phase-locked loop circuit is locked;
applying a voltage value of a node (1) of said first network to a node (5) of said second network when said second network is switched off, said node (5) of said first network ($C_1$, $C_2$, $C_3$, $R_1$, $R_2$) being situated at the interconnection of a capacitor ($C_2$) and a first end of a resistor ($R_2$) connected in series, the second end of said resistor ($R_2$) being connected to a signal oath between the input and the output of said first network of circuit components ($C_1$, $C_2$, $C_3$, $R_1$, $R_2$); and
charging of the circuit components ($C_4$, $C_5$, $C_6$, $R_3$, $R_4$) of said second network before the second network is switched in.

10. The method according to claim 9, characterized in that said oscillator signals ($U_{vco}$) are applied to a frequency modulator circuit before being applied to the phase-locked loop circuit.

* * * * *